United States Patent [19]

Kaganowicz et al.

[11] Patent Number: 4,576,829
[45] Date of Patent: Mar. 18, 1986

[54] LOW TEMPERATURE GROWTH OF SILICON DIOXIDE ON SILICON

[75] Inventors: Grzegorz Kaganowicz, Belle Mead, N.J.; John W. Robinson, Levittown; John H. Thomas, III, Holland, both of Pa.

[73] Assignee: RCA Corporation, Princeton, N.J.

[21] Appl. No.: 687,366

[22] Filed: Dec. 28, 1984

[51] Int. Cl.[4] ............................................. B05D 3/06
[52] U.S. Cl. ................................................... 427/39
[58] Field of Search ........................................ 427/39

Primary Examiner—Bernard D. Pianalto
Attorney, Agent, or Firm—Birgit E. Morris; Theodore R. Furman

[57] ABSTRACT

A low temperature, high power method of plasma oxidation for silicon dioxide films is disclosed. The method includes the use of magnetron electrodes which effectively increase the power density of the plasma. The effective power density should be between 1 and 15 Watts/cm$^2$ and preferably about 6 Watts/cm$^2$. By maintaining the substrate temperature below about 300° C., and preferably at about 130° C., it has been found that a high quality silicon dioxide film up to about 1000Å in thickness is grown. The films produced by this process have an excellent interface with the silicon, good electrical properties and good density.

3 Claims, 1 Drawing Figure

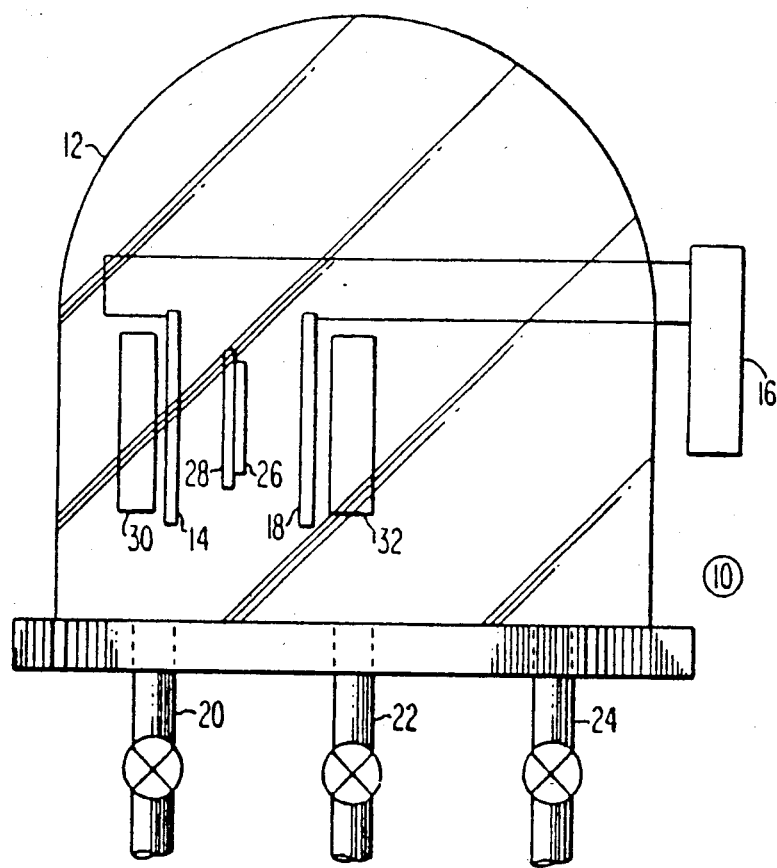

LOW TEMPERATURE GROWTH OF SILICON DIOXIDE ON SILICON

The present invention relates to an improved method for growth of thin films and more particularly is concerned with plasma oxidation of silicon at temperatures below 300° C.

BACKGROUND OF THE INVENTION

Thin silicon dioxide ($SiO_2$) films have a wide range of applications in the semiconductor industry. These films are typically formed by several methods, including thermal oxidation of silicon, plasma enhanced chemical vapor deposition (glow discharge) of silicon dioxide, plasma anodization, and plasma oxidation. While silicon dioxide formed by thermal oxidation is often of the highest quality, the temperatures required, i.e. about 1100°–1200° C., are too high for some applications.

There have been some efforts to reduce the process temperature for growing or depositing $SiO_2$. For example, in U.S. Pat. No. 4,409,260, Pastor et al. disclose a chemical vapor deposition (CVD) method for growing a uniform oxide layer on a silicon substrate. Pastor et al. carry out their process at about 750° C.

Plasma oxidation involves subjecting the substrate, such as silicon, to a glow discharge of oxygen to grow an oxide film. Plasma oxidation is disadvantageous for semiconductor applications in that the resulting silicon dioxide films, particularly the film interface, are frequently of poor quality. In addition, the growth rate is very slow and the thickness of the resulting film is extremely limited.

For example, in the report "Plasma Anodization of Metals and Semiconductors" in the Journal of Vacuum Science and Technology, Vol. 7, no. 2, p. 332, 1970 is described the process of growing an oxide on aluminum. This process produces films of only about 20 angstroms (Å) in thickness using plasma oxidation without bias.

Two recent patents by Ray et al. describe refinements in plasma oxidation parameters. U.S. Pat. No. 4,323,589 discloses using pressures of 10 mTorr and up during plasma oxidation to improve oxide growth which is reported to occur at temperatures between 300° and 550° C. In U.S. Pat. No. 4,323,057 the temperature rather than pressure is controlled. While temperatures of 300°–800° C. are disclosed, only 500 Å of $SiO_2$ is grown on silicon in 3 hours at 650° C. by this method. This provides a growth rate of only about 3 Å/minute. It is disclosed that this growth rate slows at substrate temperatures below 650° C., with no work reported below 300° C.

Besides the slow growth rates of the low temperature (300°–500° C.) oxidation methods, these methods are further limited in that the silicon dioxide films provided have poor physical and electrical properties as compared to thermally grown oxides. Specifically, most films produced by such prior art oxidation methods have a poor interface between the silicon and silicon dioxide and are usually lacking in density.

Further, many applications in the semiconductor industry require the growth of an oxide on a silicon film which overlies a substrate which is sensitive to temperatures above about 300° C. Therefore, a method of growing a film of semiconductor quality silicon dioxide at temperatures below 300° C. with a superior silicon/silicon dioxide interface and sufficient density has been sought.

SUMMARY OF THE INVENTION

A low temperature, high power method of plasma oxidation for silicon dioxide films is disclosed. The method includes the use of magnetron electrodes which effectively increase the power density of the plasma. The effective power density should be between 1 and 15 Watts/cm$^2$ and preferably about 6 Watts/cm$^2$. By maintaining the substrate temperature below about 300° C., and preferably at about 130° C., it has been found that a high quality silicon dioxide film up to about 1000 Å in thickness is grown. The films produced by this process have an excellent interface with the silicon, good electrical properties and good density.

BRIEF DESCRIPTION OF THE DRAWING

FIG. 1 illustrates an apparatus suitable for carrying out the present invention.

DETAILED DESCRIPTION OF THE INVENTION

In contrast to prior art plasma oxidation methods, the present method provides good quality $SiO_2$ films up to about 1000 Å thick at temperatures below 300° C. In fact, at about 130° C., oxide films can be grown on silicon at the rate of about 15 Å/minute as compared with prior art oxidation methods which produce oxide films are grown on silicon at about 3 Å/minute at temperatures of 650° C.

The method of the present invention utilizes magnetron electrodes, known to increase the power density of the plasma by concentrating the RF power over a smaller area. The subject method employs an effective power density of between 1 and 15 Watts/cm$^2$, and preferably about 6 Watts/cm$^2$. These power densities can be provided in the plasma by employing actual electrode power densities of only about ⅓ the value of the effective density desired.

It is generally known that in plasma deposition or oxidation systems, the use of higher power densities produces higher operating temperatures. Also, it is known that lowering the temperature or power decreases the deposition/oxidation rate, thereby adversely affecting the silicon/silicon dioxide interface and decreasing the density of the film. The present invention, however, combines a relatively high power density and a low substrate temperature (about 130° C.–300° C.) during plasma oxidation. Unexpectedly, at temperatures below 300° C., this novel process provides a reasonable growth rate and, more importantly, produces a silicon dioxide film with a semiconductor quality density and a silicon/silicon dioxide interface which is comparable to that produced by high temperature (>1000° C.) thermal oxidation processes. One would expect the higher effective power densities provided by the magnets to raise the operating temperature. It is believed that the electron flow, and thus the heat, is kept closer to the electrode by the magnets.

The present process is limited in that the growth rate decreases sharply after about 1000 angstroms of oxide have been grown. This is because the oxygen cannot diffuse through the already-grown oxide and into the silicon once the oxide is about 1000 Å thick unless the power and temperature of the plasma process are substantially increased.

A patent application entitled "Low Temperature Method of Depositing Silicon Dioxide With Increased Density" by Kaganowicz et al. and filed concurrently herewith, describes a low temperature method which can be used in conjunction with the present method to produce dielectric films above 1000 angstroms where required.

A glow discharge apparatus suitable for carrying out the present invention is shown in FIG. 1. The glow discharge apparatus 10 includes a vacuum chamber 12 which can be a glass bell jar. In the vacuum chamber 12 are two electrodes 14 and 18 which can be a screen, coil or plate of a material that is a good electrical conductor, such as aluminum. The electrodes 14 and 18 are connected to a power supply 16, which may be DC, AC or RF to produce a voltage potential. Behind the electrodes 14 and 18 are magnets 30 and 32. These magnets 30 and 32 are typically electrically insulated from the electrodes 14 and 18. An outlet 20 from the vacuum chamber 12 allows for evacuation of the system and is connected to a pumping station, not shown. A first inlet 22 and a second inlet 24 are connected to gas bleed systems not shown, for adding the appropriate gas or gases.

In carrying out the process a silicon substrate 26 (amorphous, polycrystalline or single crystal), which overlies a mounting plate 28, is placed in front of one of the electrodes 14 or 18. The substrate 26 is typically placed about 1 inch from the electrode. The mounting plate 28 should be of a material that can act as a heatsink during the oxidation process to control the temperature of the substrate 26. Such a heatsinking arrangement is described in U.S. Pat. No. 4,361,595 to Kaganowicz et al., the disclosure of which is incorporated herein by reference. The important consideration is that the plasma will tend to heat the substrate 26 well above 300° C. and therefore it is essential that the substrate temperature be maintained below about 300° C. and preferably at about 130° C. Other conventional means of maintaining the temperature of the substrate 26 can likewise be utilized. Further, as a practical matter, the mounting plate 28 should be electrically grounded to help alleviate charge build-up, known to occur on the unbiased substrate 26.

The vacuum chamber 12 is then evacuated through outlet 20 to a pressure of about 0.5 to $1.0 \times 10^{-6}$ Torr. An oxygen containing gaseous precursor is introduced into the chamber 12 through the inlet 22 to a pressure of about 50 microns. Appropriate oxygen-containing precursors include oxygen, carbon dioxide and nitrous oxide. In order to initiate the oxygen plasma, about 600 Watts of 13.56 MHz RF power is applied to the electrodes 14 and 18. The effective power density is about 6 Watts/cm$^2$. The potential between the electrodes 14, 18 is generally about 1000 volts. The magnets 30, 32 concentrate the plasma in the electrode area providing the relatively high power density. Silicon dioxide grows on the silicon substrate 26 generally at the rate of about 10 to 15 angstroms/minute.

The present method is unique in that it combines a high power density plasma oxidation with a very low substrate temperature. At temperatures below 300° C., and preferably at about 130° C., up to about 1000 angstroms of dense silicon dioxide with a very good silicon/silicon dioxide interface are grown at the rate of between about 10 and 15 angstroms/minute.

We claim:

1. A method of growing an oxide film on a silicon substrate by plasma oxidation in a magnetically enhanced glow discharge system which method comprises the steps of;
    placing the substrate in the deposition chamber of said system;
    evacuating the chamber;
    introducing a gaseous oxygen-containing precursor into the chamber;
    initiating an oxygen plasma in the chamber by applying sufficient power from a power source through a magnetron electrode to provide an effective power density of between about 1 and 15 Watts per square centimeter of electrode; and
    maintaining the temperature of the silicon substrate below about 130° C. during oxidation.

2. The method of claim 1, wherein the gaseous oxygen-containing precursor is selected from the group consisting essentially of oxygen, carbon dioxide and nitrous oxide.

3. The method of claim 1, wherein the effective power density is about 6 Watts per square centimeter.

* * * * *